(12) United States Patent
Lee et al.

(10) Patent No.: US 9,315,006 B2
(45) Date of Patent: Apr. 19, 2016

(54) FILM PEELING APPARATUS

(71) Applicant: Samsung Display Co., Ltd., Yongin, Gyeonggi-Do (KR)

(72) Inventors: Byungchul Lee, Seoul (KR); Dong Sul Kim, Hwaseong-si (KR); JaeSeok Park, Suwon-si (KR); Jinhan Park, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/245,699

(22) Filed: Apr. 4, 2014

(65) Prior Publication Data
US 2015/0101759 A1    Apr. 16, 2015

(30) Foreign Application Priority Data
Oct. 15, 2013    (KR) .................. 10-2013-0122913

(51) Int. Cl.
| | |
|---|---|
| *B32B 38/10* | (2006.01) |
| *B32B 43/00* | (2006.01) |
| *H01L 51/56* | (2006.01) |
| *H01L 51/00* | (2006.01) |

(52) U.S. Cl.
CPC .............. *B32B 38/10* (2013.01); *B32B 43/006* (2013.01); *B32B 2310/025* (2013.01); *B32B 2457/20* (2013.01); *B32B 2457/206* (2013.01); *H01L 51/0013* (2013.01); *H01L 51/56* (2013.01); *Y10T 156/1126* (2015.01); *Y10T 156/1153* (2015.01); *Y10T 156/1174* (2015.01); *Y10T 156/1911* (2015.01); *Y10T 156/1944* (2015.01); *Y10T 156/1956* (2015.01); *Y10T 156/1978* (2015.01)

(58) Field of Classification Search
CPC  B32B 43/006; B32B 38/00; Y10T 156/1978; Y10T 156/1956; Y10T 156/1944; Y10T 156/1911; Y10T 156/1126; Y10T 156/1153; Y10T 156/1174
See application file for complete search history.

(56) References Cited

U.S. PATENT DOCUMENTS

| | | | | |
|---|---|---|---|---|
| 4,880,488 | A * | 11/1989 | Matsuo et al. ................. | 156/702 |
| 5,540,809 | A * | 7/1996 | Ida et al. ......................... | 156/760 |
| 6,500,298 | B1 * | 12/2002 | Wright et al. .................. | 156/708 |
| 7,481,901 | B2 * | 1/2009 | Toyoda et al. ................. | 156/248 |
| 8,110,069 | B2 * | 2/2012 | Garben ........................... | 156/715 |
| 8,137,503 | B2 * | 3/2012 | Hiranaka et al. .............. | 156/703 |
| 2008/0011420 | A1 * | 1/2008 | Yoshizawa et al. ........... | 156/344 |
| 2009/0078365 | A1 * | 3/2009 | Suehara et al. ................ | 156/249 |
| 2013/0048223 | A1 * | 2/2013 | Ahn ............................... | 156/718 |

FOREIGN PATENT DOCUMENTS

| | | |
|---|---|---|
| KR | 10-2006-0033649 | 4/2006 |
| KR | 10-2006-0053370 | 5/2006 |
| KR | 10-2009-0052656 | 5/2009 |
| KR | 10-2011-0023811 | 3/2011 |
| KR | 10-2012-0002046 | 1/2012 |
| KR | 10-2012-0008678 | 2/2012 |

\* cited by examiner

*Primary Examiner* — Mark A Osele
*Assistant Examiner* — Nickolas Harm
(74) *Attorney, Agent, or Firm* — Innovation Counsel LLP

(57) ABSTRACT

A film peeling apparatus that peels a film attached to a substrate includes a chamber, a transfer unit, and first peeling rollers. The transfer unit is disposed in the chamber to transfer the substrate. The first peeling rollers are disposed in the chamber, each of the first peeling rollers includes a first electrostatic chuck to adsorb a first film attached to the substrate. The first peeling rollers roll the adsorbed first film to peel the first film from the substrate.

12 Claims, 11 Drawing Sheets

FILM PEELING APPARATUS

CROSS-REFERENCE TO RELATED APPLICATION

This U.S. non-provisional patent application claims priority under 35 U.S.C. §119 to Korean Patent Application No. 10-2013-0122913, filed on Oct. 15, 2013, the contents of which are hereby incorporated by reference in its entirety.

BACKGROUND

1. Field of Disclosure

The present disclosure relates to a film peeling apparatus. More particularly, the present disclosure relates to a film peeling apparatus capable of easily peeling off a film attached to a substrate.

2. Description of the Related Art

Among flat panel display apparatuses, an organic light emitting display apparatus self-emits light to display an image. The organic light emitting display apparatus has advantages, such as low power consumption, fast response speed, etc., and thus it gradually replaces a liquid crystal display. The organic light emitting display apparatus includes an organic light emitting diode disposed in each pixel area, and the organic light emitting diode includes a cathode, an anode, and an organic light emitting layer interposed between the cathode and the anode.

Meanwhile, when the organic light emitting layer of the organic light emitting display apparatus is manufactured, a deposition method or a laser induced thermal imaging method is widely used. According to the laser induced thermal imaging method, a donor film on which the organic light emitting layer is formed is attached to the substrate and a laser beam is irradiated to the donor film, so that the organic light emitting layer is transferred to the substrate from the donor film. After the organic light emitting layer is transferred to the substrate, the donor film is peeled off from the substrate.

SUMMARY

The present disclosure provides a film peeling apparatus capable of easily peeling a film attached to a substrate.

Embodiments of the inventive concept provide a film peeling apparatus that peels a film attached to a substrate including a chamber, a transfer unit, and first peeling rollers. The transfer unit is disposed in the chamber to transfer the substrate. The first peeling rollers are disposed in the chamber, each of the first peeling rollers includes a first electrostatic chuck to adsorb a first film attached to the substrate. The first peeling rollers roll the adsorbed first film to peel the first film from the substrate.

Embodiments of the inventive concept provide a film peeling apparatus that peels a film attached to a substrate including a chamber, a transfer unit, and first peeling rollers. The transfer unit is disposed in the chamber to transfer the substrate. The first peeling rollers are disposed in the chamber roll a first film attached to the substrate to peel the first film from the substrate. The first peeling rollers include a gas spray part to spray gas to the first film.

Embodiments of the inventive concept provide a film peeling apparatus that peels a film attached to a substrate including a chamber, a transfer unit, and first peeling rollers. The transfer unit is disposed in the chamber to transfer the substrate. The first peeling rollers are disposed in the chamber and roll a first film attached to the substrate to peel the first film from the substrate. The first peeling rollers include a temperature controller.

According to the above, the rollers used to peel the donor film attached to the substrate include the electrostatic chuck, and thus the adsorptive force between the donor film and the rollers is sufficiently secured by the electrostatic force generated by the electrostatic chuck. Therefore, the donor film is not pressurized to the substrate and the rotational force of the rollers is easily applied to the donor film even though the rollers are spaced apart from the substrate while rolling the donor film, thereby easily performing the film peeling process. In addition, the transfer quality of the organic light emitting layer may be prevented from being lowered due to the pressure partially applied to the donor film and the substrate by the rollers.

BRIEF DESCRIPTION OF THE DRAWINGS

The above and other advantages of the present disclosure will become readily apparent with reference to the following detailed description when considered in conjunction with the accompanying drawings wherein.

DETAILED DESCRIPTION

Figure 1A:
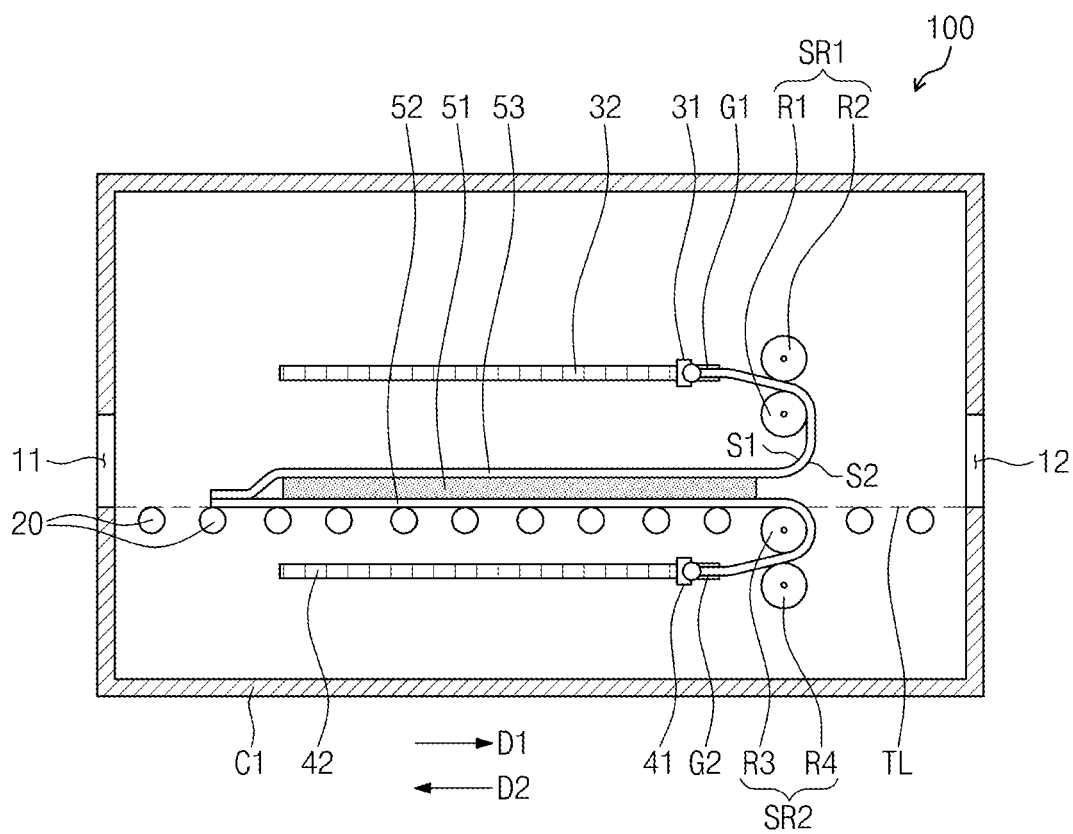
FIG. 1A is a view showing a film peeling apparatus according to an exemplary embodiment of the present disclosure.

It will be understood that when an element or layer is referred to as being "on", "connected to" or "coupled to" another element or layer, it can either be formed directly on, connected or coupled to the other element or layer, or formed with intervening elements or layers. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, the described elements, components, regions, layers and/or sections are not limited by the terms used. The terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features may then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit the inventive concept. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, the present inventive concept will be explained in detail with reference to the accompanying drawings.

Figure 1B:
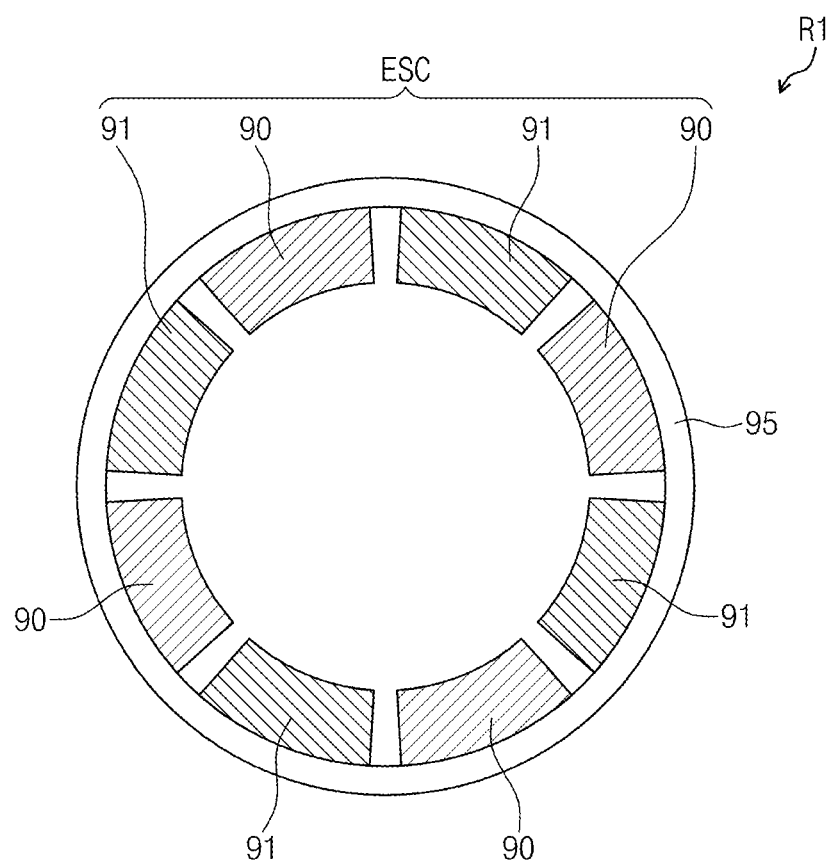
FIG. 1B is a cross-sectional view showing a first roller shown in FIG. 1A.
Figure 2:
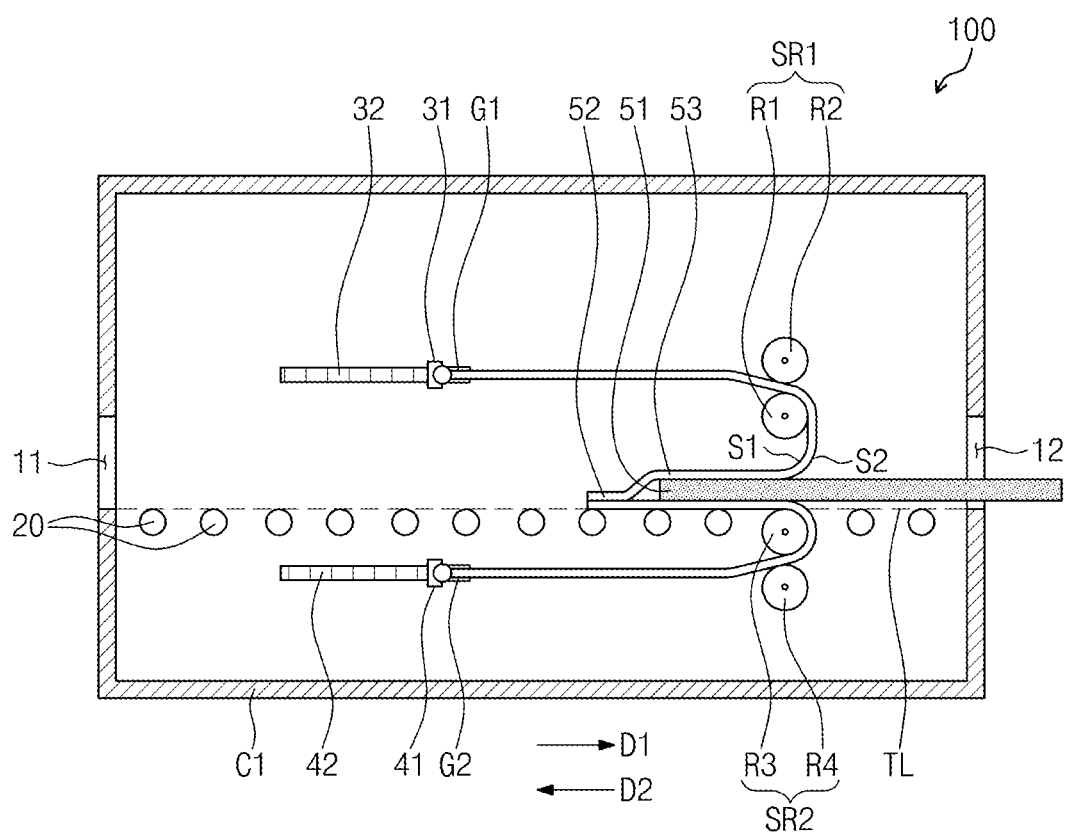
FIG. 2 is a view showing an operation of the film peeling apparatus shown in FIG. 1A.

FIG. 1A is a view showing a film peeling apparatus according to an exemplary embodiment of the present disclosure, FIG. 1B is a cross-sectional view showing a first roller shown in FIG. 1A, and FIG. 2 is a view showing an operation of the film peeling apparatus shown in FIG. 1A.

Referring to FIGS. 1A, 1B, and 2, a film peeling apparatus 100 is used to peel off a film attached to a substrate 51 when an organic light emitting display apparatus is manufactured. In detail, a donor film 53 on which an organic light emitting layer is formed is attached to a surface of the substrate 51 and a sealing film 52 is attached to the other surface of the substrate 51 to seal the substrate 51 in cooperation with the donor film 53. Then, when a laser induced thermal imaging process is performed on the donor film 53, the organic light emitting layer is transferred to the substrate 51 from the donor film 53. After that, a film peeling process is performed to peel off the donor film 53 and the sealing film 52 from the substrate 51 using the film peeling apparatus 100.

The film peeling apparatus 100 includes a chamber C1, a transfer unit 20 disposed in the chamber C1, first peeling rollers SR1, second peeling rollers SR2, a first grip unit G1, a second grip unit G2, a first driving unit 31, and a second driving unit 41.

An inside of the chamber C1 is maintained in a low pressure, for example, a vacuum, an inlet 11 is formed through a sidewall of the chamber C1, and an outlet 12 is formed through the other sidewall of the chamber C1, which faces the sidewall. Accordingly, the substrate 51 to which the donor film 53 and the sealing film 52 are attached is loaded into the chamber C1 through the inlet 11, the film peeling process is performed on the substrate 51 using the film peeling apparatus 100, and the substrate 51 on which the film peeling process is performed is withdrawn to the outside of the chamber C1 through the outlet 12.

The transfer unit 20 is disposed inside the chamber C1 to transfer the substrate 51. The transfer unit 20 includes a plurality of transfer rollers arranged along a transfer line TL and spaced apart from each other. Therefore, the transfer rollers 20 are rotated in the same direction to transfer the substrate 51 in a first direction D1 along the transfer line TL. The transfer unit 20 may include other transfer devices such as a transfer belt, etc.

The first peeling rollers SR1 roll the donor film 53 to peel the donor film 53 off from the substrate 51. The first peeling rollers SR1 include a first roller R1 and a second roller R2, which face each other, the first roller R1 rolls an upper surface S1 of the donor film 53, and the second roller R2 rolls a lower surface S2 of the donor film 53.

The first and second rollers R1 and R2 are disposed to be spaced apart from the substrate 51. The first peeling rollers SR1 roll the donor film 53, and thus the donor film 53 is not pressurized to the substrate 51 by the first peeling rollers SR1 while the film peeling process is performed.

At least one of the first and second rollers R1 and R2 may include an electrostatic chuck ESC. Accordingly, when the film peeling process is performed, the first and second rollers R1 and R2 adsorb the donor film 53 using electrostatic force generated by the electrostatic chuck ESC while rolling the donor film 53. Both of the first and second rollers R1 and R2 may be the electrostatic chuck ESC.

Hereinafter, the electrostatic chuck ESC in the first roller R1 will be described in detail as a representative example.

The first roller R1 includes a base metal, such as a stainless steel, and a thin dielectric layer. In the present exemplary embodiment, the electrostatic chuck ESC includes a plurality of first magnets 90 each having a first polarity and a plurality of second magnets 91 each having a second polarity different from the first polarity. In addition, the first and second magnets 90 and 91 are alternately and repeatedly arranged along a surface of the first roller R1. Therefore, the donor film 53 may be adsorbed to the first roller R1 by the electrostatic force generated between the electrostatic chuck ESC and the donor film 53 wrapped around the first roller R1. The surface of the first roller R1 is coated with a thin dielectric film 95.

As described above, when the first and second rollers R1 and R2 roll the donor film 53 and the donor film 53 is adsorbed to the first and second rollers R1 and R2 by the electrostatic force generated from the electrostatic chuck ESC, the following effects occur.

In general, as the adsorptive force in which the donor film 53 is adsorbed to the first peeling rollers SR1 becomes high, a rotational force of the first peeling rollers SR1 may be easily transferred to the donor film 53. As a result, the donor film 53 may be easily peeled off from the substrate 51. However, when each of the first peeling roller SR1 does not include the electrostatic chuck ESC, the first roller R1 are required to pressurize the donor film 53 toward the substrate 51 to secure the adsorptive force. A high pressure may be partially applied to the donor film 53 and the substrate 51 due to rigid foreign substances inadvertently disposed on the surface of the first roller R1, and thus the transfer quality of the organic light emitting layer transferred to the substrate 51 from the donor film 53 may be deteriorated.

If at least one of the first and second rollers R1 and R2 includes the electrostatic chuck ESC, the adsorptive force may be sufficiently secured by the electrostatic force generated by the electrostatic chuck ESC. Accordingly, the donor film 53 is not required to be pressurized to the substrate 51 by the first roller R1 to secure the adsorptive force. Thus, the film peeling process may be easily performed and the transfer quality of the organic light emitting layer transferred to the substrate may not be deteriorated due to the rigid foreign substances inadvertently disposed on the surface of the first roller R1. The second peeling rollers SR2 are disposed inside the chamber C1 to face the first peeling rollers SR1 and the substrate 51 is disposed between the second peeling rollers SR2 and the first peeling rollers SR1. The second peeling rollers SR2 roll the sealing film 52 to peel the sealing film 52 off from the substrate 51. The second peeling rollers SR2 include a third roller R3 and a fourth roller R4. The third roller R3 rolls one surface of the sealing film 53 and the fourth roller R4 is spaced apart from the substrate 51 to roll the other surface of the sealing film 53. The third roller R3 may contact a lower surface of the substrate in which the organic light emitting layer is not transferred.

The first grip unit G1 is disposed above the transfer line TL to be adjacent to the first peeling rollers SR1. The first grip unit G1 has a clamp to hold an end of the donor film 53 peeled off by the first peeling rollers SR1. In addition, the second grip unit G2 is disposed under the transfer line TL to be adjacent to the second peeling rollers SR2. In the present exemplary embodiment, the second grip unit G2 has a clamp to hold an end of the sealing film 52 peeled off by the second peeling rollers SR2.

The first driving unit 31 is coupled to the first grip unit G1 to move the first grip unit G1 in the first direction D1 and a second direction D2 opposite to the first direction along a first transfer guide 32. In addition, the second driving unit 41 is coupled to the second grip unit G2 to move the second grip unit G2 in the first direction D1 and the second direction D2 along a second transfer guide 42.

Accordingly, when the first and second peeling rollers SR1 and SR2 having the electrostatic chuck ESC roll the donor film 53 and the sealing 52 and the first and second grip units G1 and G2 gripping the donor film 53 and the sealing film 52 move to the second direction D2 by the first and second driving units 31 and 41, the film peeling process may be more easily performed without deterioration of transfer quality of the organic light emitting layer.

In addition, since a moving speed of the first and second grip units G1 and G2 may be controlled by adjusting a driving force of the first and second driving units 31 and 41, the peeling speed of the donor film 53 and the sealing film 52 from the substrate 51 may be controlled to prevent the transfer quality from being deteriorated.

In the present exemplary embodiment, the sealing film 52 is attached to the lower surface of the substrate 51 and the donor film 53 is attached to the upper surface of the substrate 51, but they should not be limited thereto or thereby. That is, the sealing film 52 and the donor film 53 may be attached to the upper and lower surfaces of the substrate 51, respectively. In this case, the first peeling rollers SR1 are disposed under the substrate 51 to roll the donor film 53 and the second peeling rollers SR2 are disposed above the substrate 51 to roll the sealing film 52.

Figure 3:
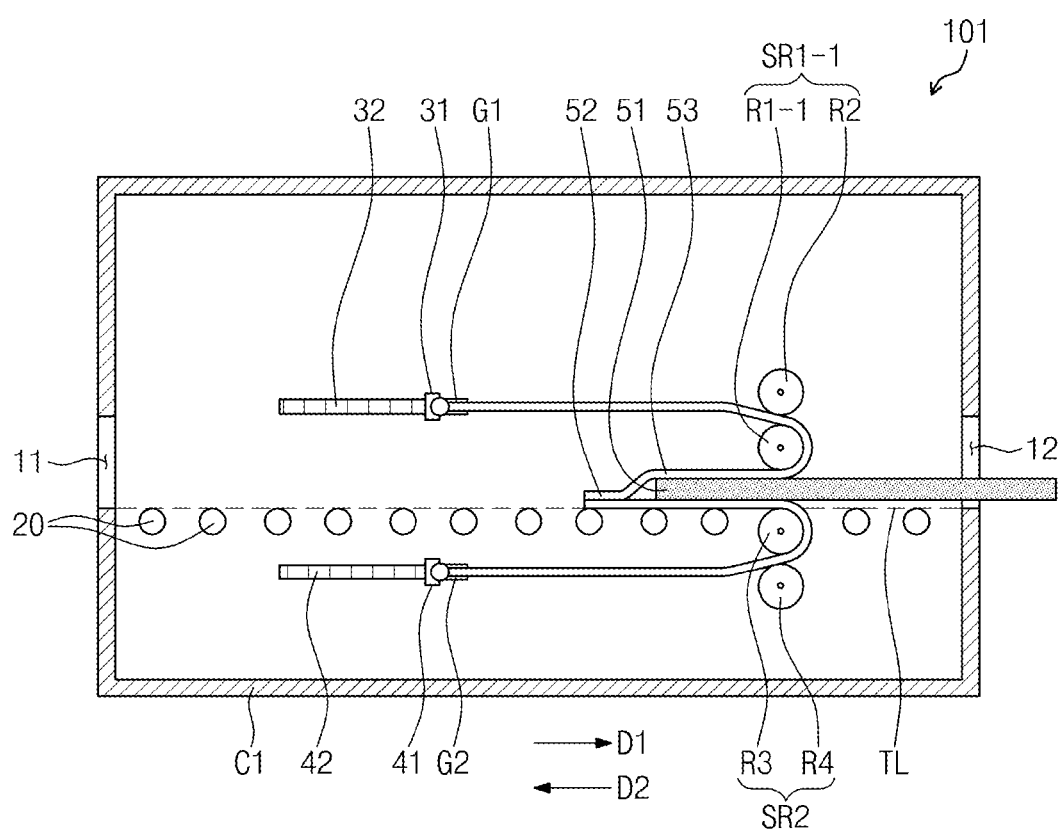
FIG. 3 is a view showing a film peeling apparatus according to another exemplary embodiment of the present disclosure.

FIG. 3 is a view showing a film peeling apparatus according to another exemplary embodiment of the present disclosure. In FIG. 3, the same reference numerals denote the same elements in FIG. 2, and thus detailed descriptions of the same elements will be omitted.

Referring to FIG. 3, a film peeling apparatus 101 includes first peeling rollers SR1-1 and second peeling rollers SR2. The first peeling rollers SR1-1 include a first roller R1-1 and a second roller R2, and at least one of the first and second rollers R1-1 and R2 includes the electrostatic chuck ESC (refer to FIG. 1B) therein. Both of the first and second rollers R1-1 and R2 may include the electrostatic chuck ESC.

Referring to FIG. 1A, the first peeling rollers SR1 of the film peeling apparatus 100 are disposed to be spaced apart from the substrate 51 while rolling the donor film 53 when the film peeling process is performed. According to the present exemplary embodiment shown in FIG. 3, the first roller R1-1 of the first peeling rollers R1-1 rolls the donor film 53 while making contact with the substrate 51 with an intervening donor film 53 when the film peeling process is performed.

Since one of the first and second rollers R1-1 and R2 includes the electrostatic chuck, the first and second rollers R1-1 and R2 may adsorb the donor film 53 using the electrostatic chuck during the film peeling process. Therefore, the donor film 53 is adsorbed to the first peeling rollers SR1-1 and the rotational force of the first peeling rollers SR1-1 may be easily applied to the donor film 53. Thus, although the first roller R1-1 makes contact with the substrate 51 with an intervening donor film 53 when the first roller R1-1 rolls the donor film 53, the force of the first roller R1-1, which is applied to the donor film 53 toward the substrate 51, may be eliminated or considerably reduced. Consequently, the transfer quality may be prevented from being deteriorated due to the pressure partially applied to the donor film 53 and the substrate 51 by the first roller R1-1.

Figure 4A:
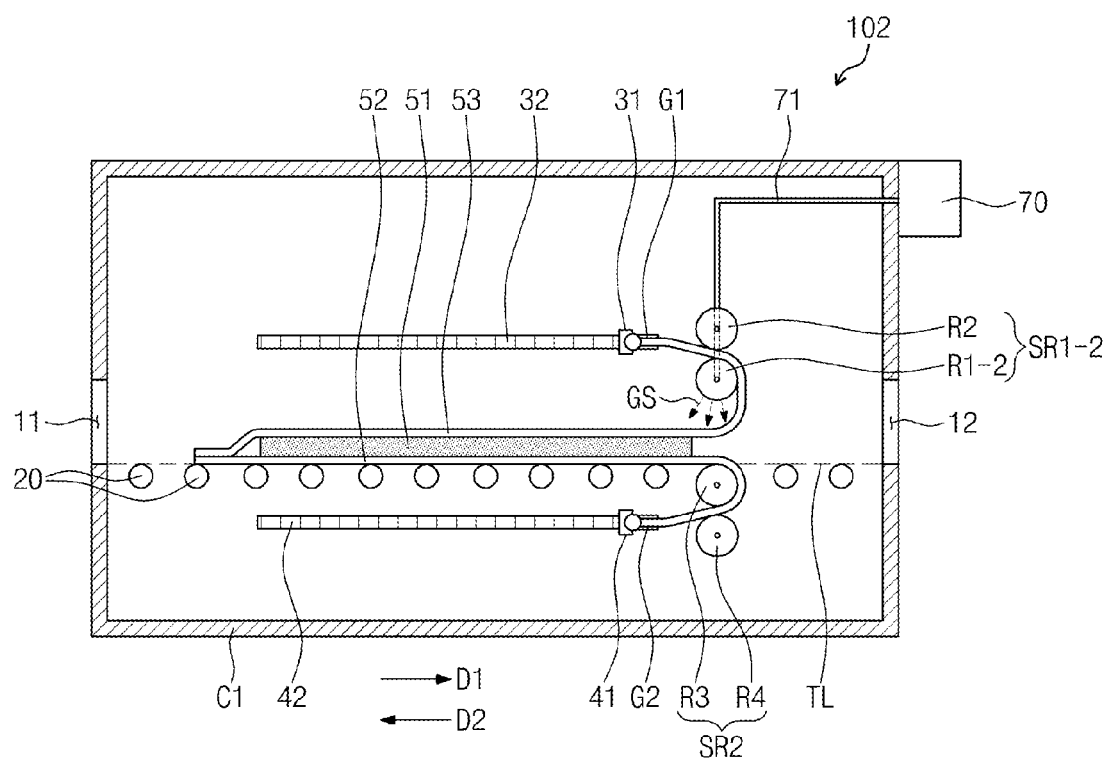
FIG. 4A is a view showing a film peeling apparatus according to another exemplary embodiment of the present disclosure.
Figure 4B:
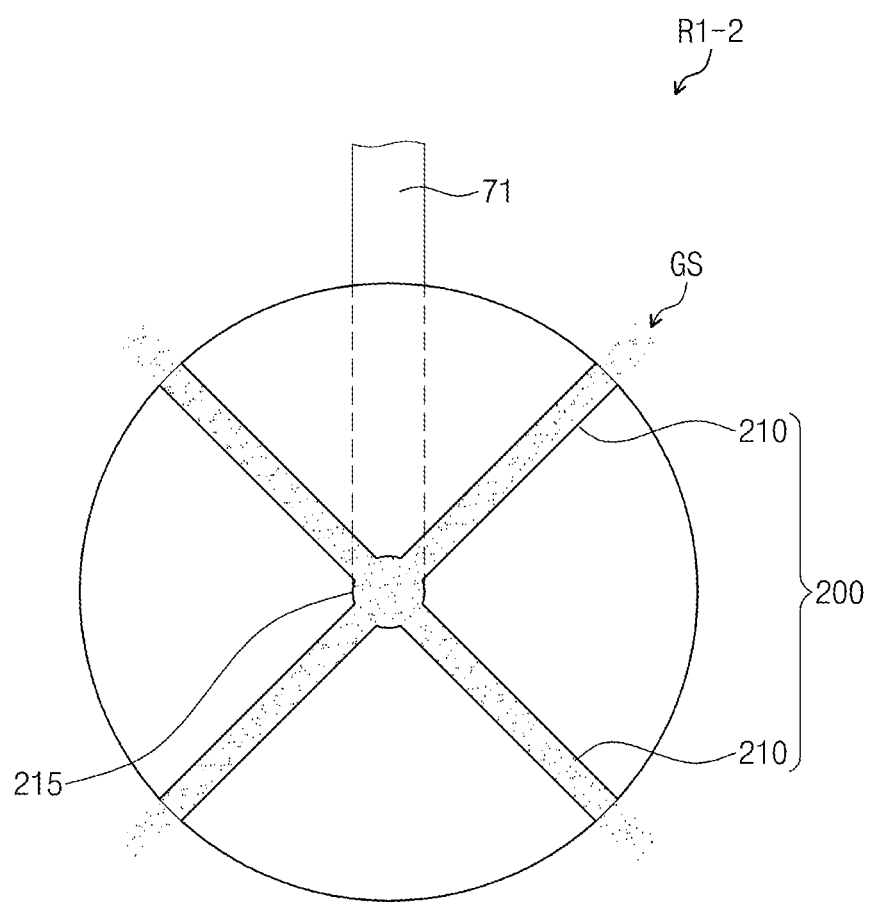
FIG. 4B is a cross-sectional view showing a first roller shown in FIG. 4A.
Figure 5:
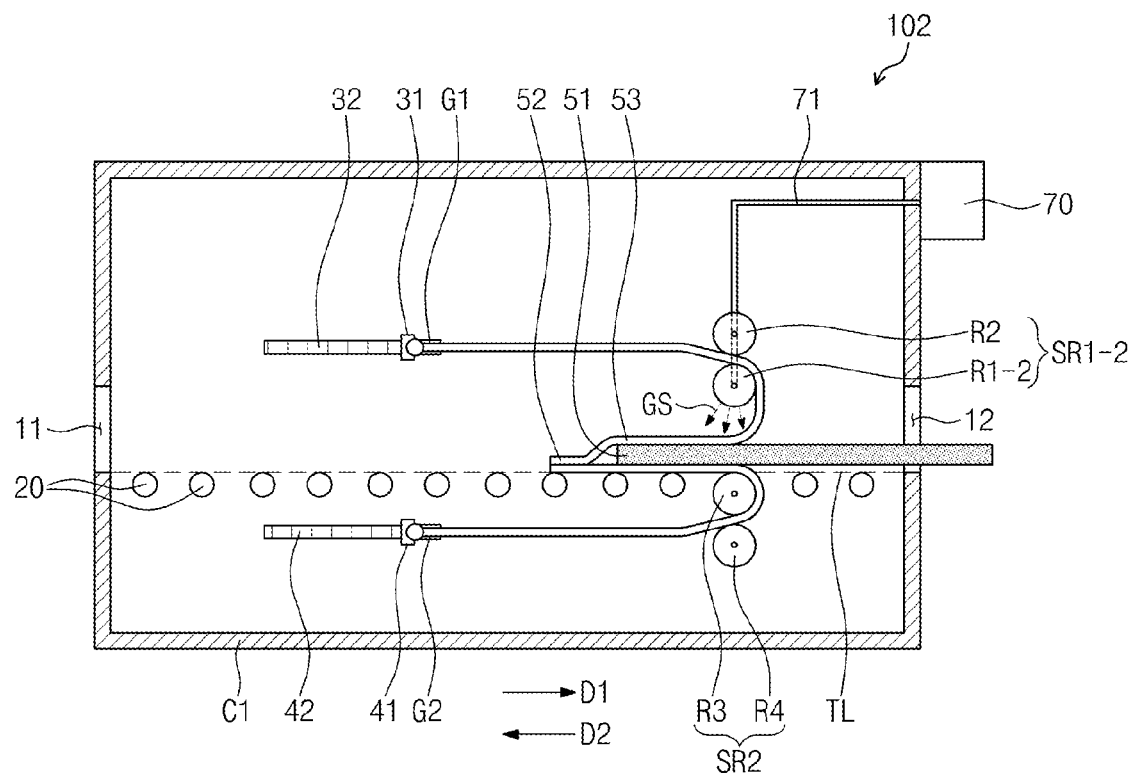
FIG. 5 is a view showing an operation of the film peeling apparatus shown in FIG. 4A.

FIG. 4A is a view showing a film peeling apparatus according to another exemplary embodiment of the present disclosure, FIG. 4B is a cross-sectional view showing a first roller shown in FIG. 4A, and FIG. 5 is a view showing an operation of the film peeling apparatus shown in FIG. 4A. In FIGS. 4A, 4B, and 5, the same reference numerals denote the same elements in FIGS. 1A, 1B, and 2, and thus detailed descriptions of the same elements will be omitted.

Referring to FIGS. 4A, 4B, and 5, a film peeling apparatus 102 includes first peeling rollers SR1-2, second peeling rollers SR2, a gas supply unit 70, and a gas pipe 71, and the first peeling rollers SR1-2 are disposed to be spaced apart from the substrate 51.

At least one of the first and second rollers R1-2 and R2 may include an electrostatic chuck ESC. Both of the first and second rollers R1-2 and R2 may be the electrostatic chuck ESC.

The first peeling rollers SR1-2 include a first roller R1-2 and a second roller R2. The first roller R1-2 may further include a gas spray part 200, which is defined by a plurality of gas discharge portions 210 formed through the first roller R1-2 and extending to a surface of the first roller R1-2.

The gas spray part 200 is connected to the gas supply unit 70 to receive gas GS from the gas supply unit 70. For instance, a gas path 215 is formed in the first roller R1-2 along a longitudinal direction of the first roller R1-2 and connected to the gas discharge portions 210. In addition, the gas path 215 is connected to the gas supply unit 70 through the gas pipe 71 at one side of the first roller R1-2. Accordingly, when the gas supply unit 70 supplies the gas GS to the gas path 215 through the gas pipe 71, the gas GS is discharged to the outside of the first roller R1-2 through the gas discharge portions 210.

As described with reference to FIG. 2, when the first and second peeling rollers SR1-2 and SR2 roll the donor film 53 and the sealing film 52 to perform the film peeling process while the first and second grip units G1 and G2 grip the donor film 53 and the sealing film 52, the first roller R1-2 rolls the upper surface of the donor film 53 and substantially simultaneously sprays the gas GS to the donor film 53 using the gas spray part 200.

Thus, during the film peeling process, the donor film 53 may be uniformly pressurized to the substrate 51 by the gas GS discharged from the gas spray part 200. As a result, the donor film 53 is not pressurized to the substrate 51 during the film peeling process, and thus the transfer quality of the organic light emitting layer transferred to the substrate 51 from the donor film 53 may not be deteriorated by the pressure partially applied to the substrate 51 and the donor film 53 due to foreign substances attached to the surface of the first roller R1-2.

Figure 6A:
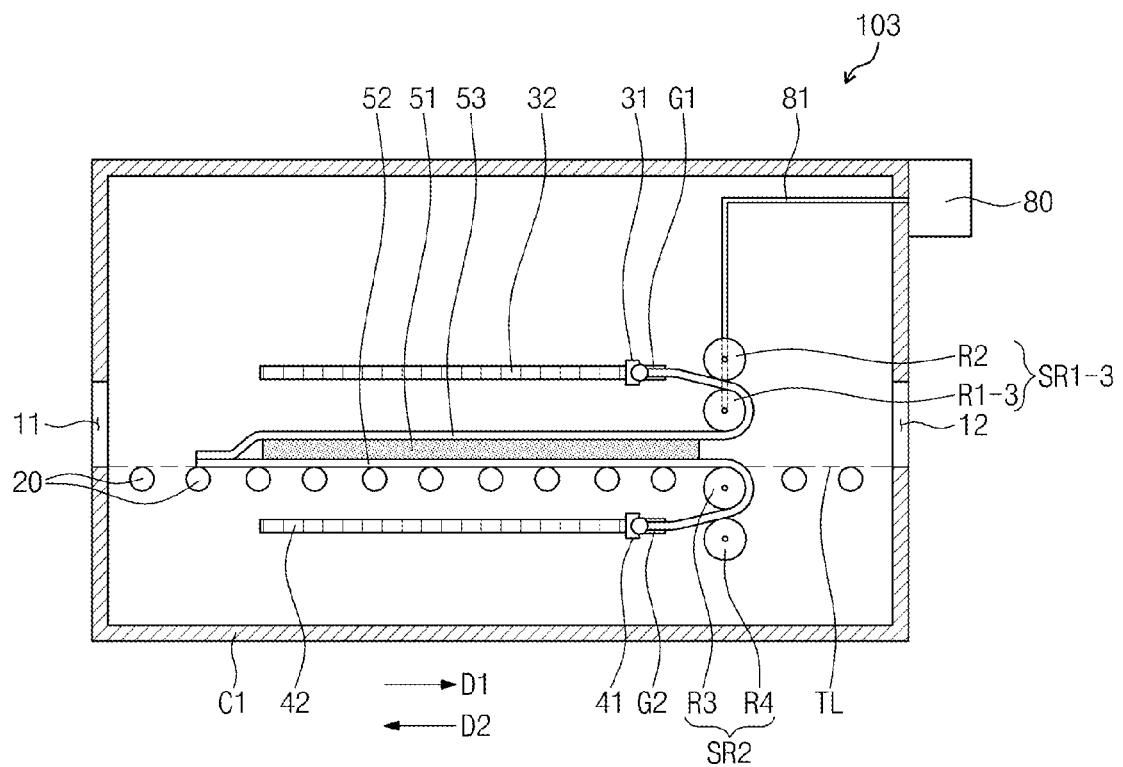
FIG. 6A is a view showing a film peeling apparatus according to another exemplary embodiment of the present disclosure.
Figure 6B:
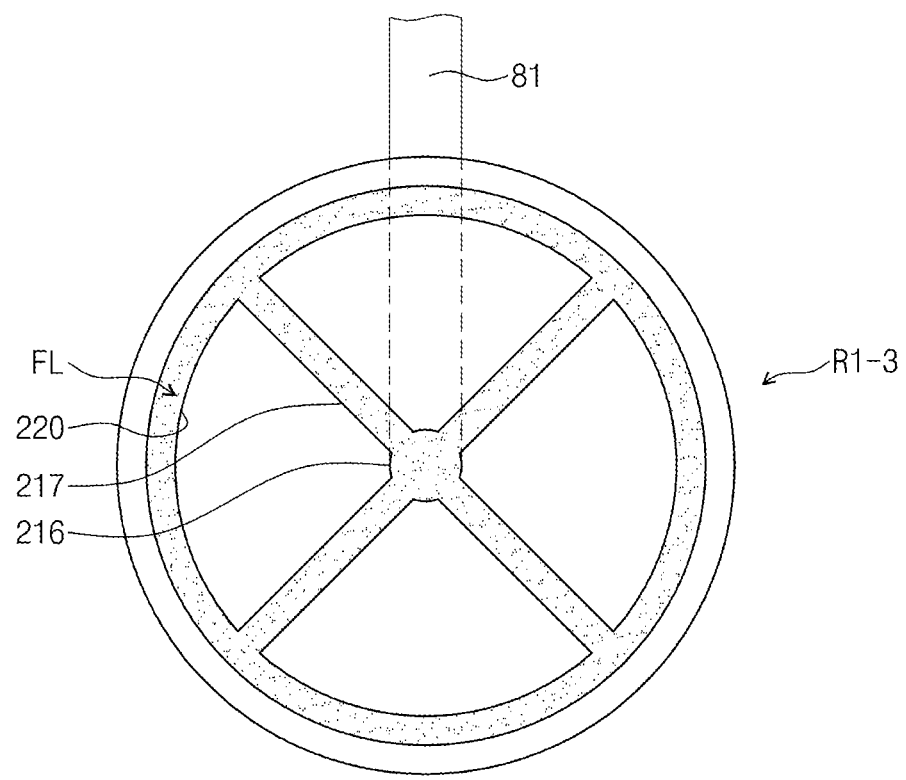
FIG. 6B is a cross-sectional view showing a first roller shown in FIG. 6A.
Figure 7:
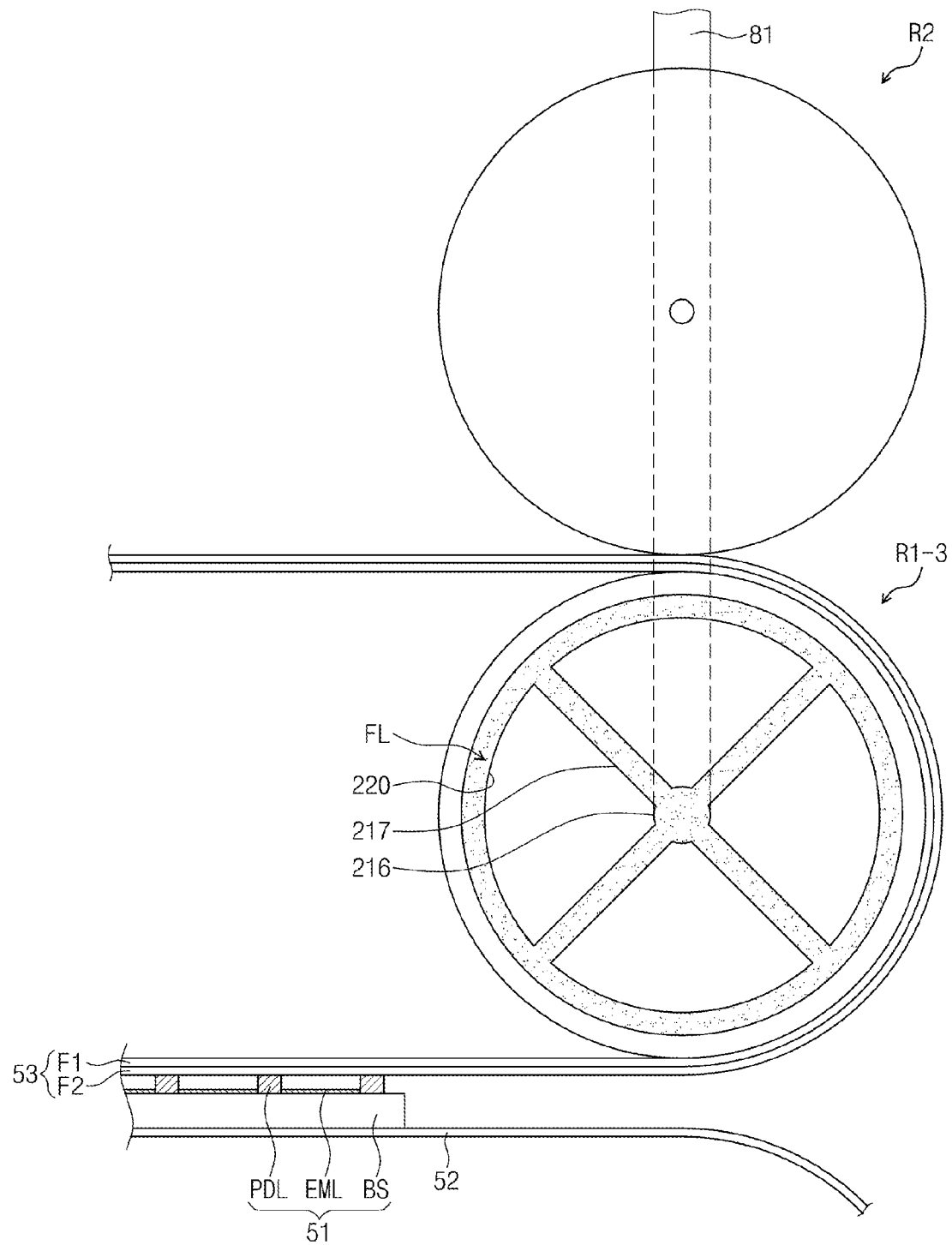
FIG. 7 is a view showing an operation of the first roller shown in FIG. 6A.

FIG. 6A is a view showing a film peeling apparatus according to another exemplary embodiment of the present disclosure, FIG. 6B is a cross-sectional view showing a first roller shown in FIG. 6A, and FIG. 7 is a view showing an operation of the first roller shown in FIG. 6A.

Referring to FIGS. 6A, 6B, and 7, a film peeling apparatus 103 includes first peeling rollers SR1-3, second peeling rollers SR2, a fluid supply unit 80, and a fluid pipe 81.

The first peeling rollers SR1-3 include a first roller R1-3 and a second roller R2. The first roller R1-3 may further include a temperature controller 220. The temperature controller 220 is disposed in the first roller R1-3 and has a pipe shape extending along the surface of the first roller R1-3.

In addition, a fluid path 216 is formed in the first roller R1-3 along a longitudinal direction of the first roller R1-3 and connected to the temperature controller 220 through a plurality of connection portions 217. The fluid path 216 may be connected to the fluid supply unit 80 through the fluid pipe 81 at one side of the first roller R1-3. Accordingly, when the fluid supply unit 80 supplies a fluid FL to the fluid path 216 through the fluid pipe 81, the fluid FL is provided to the temperature controller 220 through the connection portions 217.

In the present exemplary embodiment, the fluid FL may be cooling water. Therefore, when the fluid FL is provided to the temperature controller 220, the surface of the first roller R1-3 may be cooled by the fluid FL. As described above, when the surface of the first roller R1-3 is cooled by the fluid FL, the following effects occur.

As described with reference to FIG. 1A, the laser induced thermal imaging process is performed on the substrate 51, to which the donor film 53 and the sealing film 52 are attached, before the film peeling process is performed, and the organic light emitting layer EML formed on the donor film 53 is transferred to the substrate 51. The donor film 53 includes a base film F1 and a light-to-heat conversion layer F2 formed on the base film F1, and light energy of the laser beam irradiated to the donor film 53 is converted to heat energy by the light-to-heat conversion layer F2 during the laser induced thermal imaging process. Therefore, a volume of the light-to-heat conversion layer F2 increases by the heat energy, so that the organic light emitting layer EML makes contact with pixel areas defined by pixel definition layers PDL disposed on a base substrate BS. As a result, the organic light emitting layer EML may be transferred to the substrate 51 from the donor substrate 53.

If the film peeling process is performed while the light-to-heat conversion layer F2 is not cooled and has the increased volume, the light-to-heat conversion layer F2 may partially make contact with the organic light emitting layer EML transferred to the base substrate BS. Accordingly, during the film peeling process, a portion of the organic light emitting layer EML transferred to the substrate 51 may be retransferred to the light-to-heat conversion layer F2. In the present exemplary embodiment, however, the light-to-heat conversion layer F2 is cooled by the temperature controller 220 during the film peeling process and the volume of the light-to-heat conversion layer F2 is reduced. Therefore, a gap occurs between the light-to-heat conversion layer F2 and the organic light emitting layer EML, thereby preventing the organic light emitting layer EML from being retransferred to the light-to-heat conversion layer F2.

At least one of the first and second rollers R1-3 and R2 may include an electrostatic chuck ESC. Both of the first and second rollers R1-3 and R2 may be the electrostatic chuck ESC.

The first roller R1-3 may further include a gas spray part 200, as disclosed in FIGS. 4A, 4B and 5, which is defined by a plurality of gas discharge portions 210 formed through the first roller R1-3 and extending to a surface of the first roller R1-3.

Figure 8:
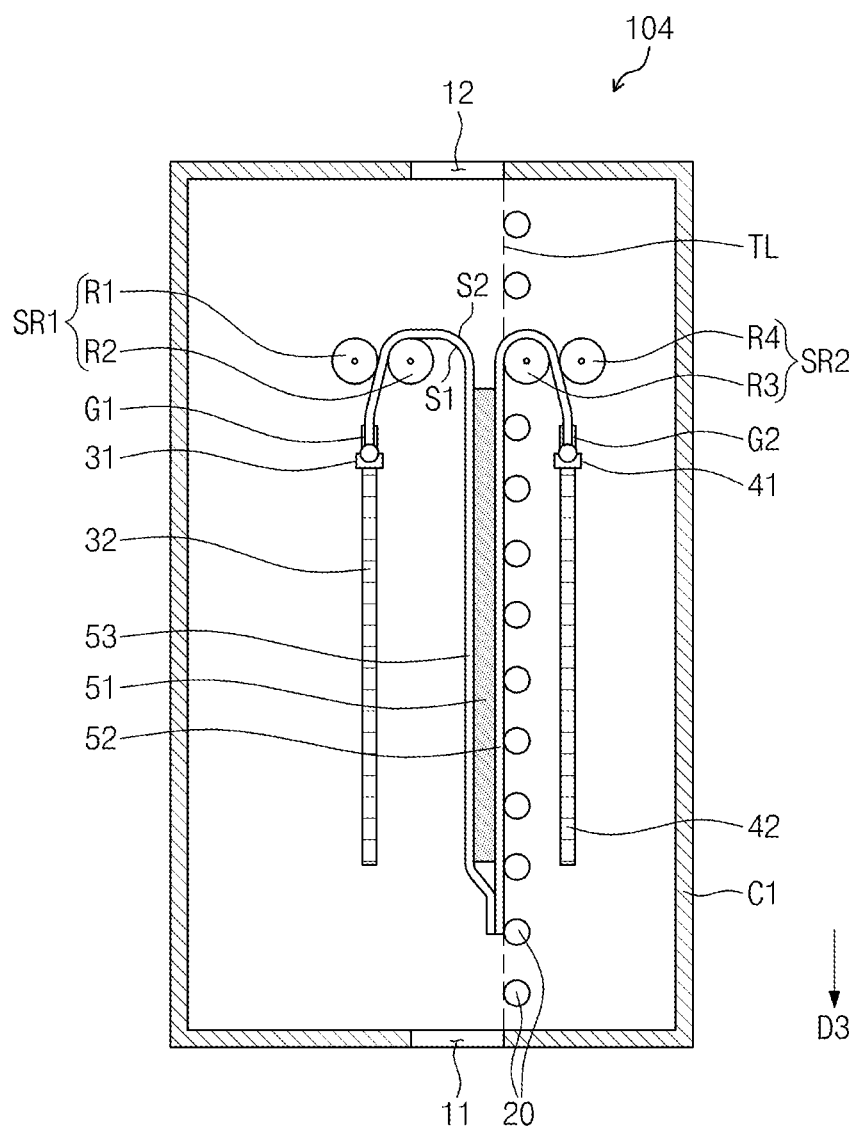
FIG. 8 is a view showing a film peeling apparatus according to another exemplary embodiment of the present disclosure.

FIG. 8 is a view showing a film peeling apparatus according to another exemplary embodiment of the present disclosure. In FIG. 8, the same reference numerals denote the same elements in FIGS. 1A, 1B, and 2, and thus detailed descriptions of the same elements will be omitted.

At least one of the first and second rollers R1 and R2 may include an electrostatic chuck ESC. Both of the first and second rollers R1 and R2 may be the electrostatic chuck ESC.

Referring to FIG. 8, a film peeling apparatus 104 shown in FIG. 8 has the similar structure to that of the film peeling apparatus 100 shown in FIG. 1A, but the film peeling apparatus 104 peels the donor film 53 and the sealing film 52 from the substrate 51 along a gravity direction D3.

In this case, particles generated from the substrate 51, the sealing film 52, and the donor film 53 during the film peeling process move in the gravity direction D3 of the chamber C1. Accordingly, the particles may be prevented from entering to the substrate 51 on which the film peeling process is completely performed.

Although the exemplary embodiments of the present invention have been described, it is understood that the present invention should not be limited to these exemplary embodiments but various changes and modifications can be made by one having ordinary skilled in the art within the spirit and scope of the present invention as hereinafter claimed.

What is claimed is:

1. A film peeling apparatus that peels a film attached to a substrate, comprising:
   a chamber;
   a transfer unit disposed in the chamber to transfer the substrate; and
   a first peeling roller disposed in the chamber, the first peeling roller including a first electrostatic chuck to adsorb a first film attached to the substrate,
   wherein the electrostatic chuck includes a plurality of first magnets each having a first polarity and a plurality of second magnets each having a second polarity different from the first polarity, and
   wherein the first peeling roller rolling the adsorbed first film to peel the first film from the substrate.

2. The film peeling apparatus of claim 1, wherein the first peeling roller comprises:

a first roller that adsorbs and rolls an upper surface of the first film; and a second roller facing the first roller such that the first film is disposed between the first and second rollers, and the second roller rolling a lower surface of the first film.

3. The film peeling apparatus of claim 2, wherein the first peeling roller is spaced apart from the substrate while rolling the first film.

4. The film peeling apparatus of claim 2, wherein one of the first and second rollers makes contact with the substrate while rolling the first film.

5. The film peeling apparatus of claim 1, further comprising a second peeling roller disposed in the chamber to face the first peeling roller such that the substrate is disposed between the first peeling roller and the second peeling roller, wherein the second peeling roller rolls a second film that seals the substrate in cooperation with the first film to peel the second film from the substrate.

6. The film peeling apparatus of claim 5, further comprising:

grip units disposed in the chamber to respectively grip the first and second films peeled from the substrate; and driving units coupled to the grip units to move the grip units in the chamber.

7. A film peeling apparatus that peels a film attached to a substrate, comprising:

a chamber;

a transfer unit disposed in the chamber to transfer the substrate;

a first peeling roller disposed in the chamber, the first peeling roller rolling a first film attached to the substrate to peel the first film from the substrate, and the first peeling roller including a temperature controller disposed in the first peeling roller, the temperature controller cooling the first peeling roller, and a connection pipe disposed in the first peeling roller, the connecting pipe connecting the temperature controller to a fluid path disposed in a center of the first peeling roller.

8. The film peeling apparatus of claim 7, wherein the first peeling roller comprises:

a first roller that rolls an upper surface of the first film; and a second roller facing the first roller such that the first film is disposed between the first and second rollers, and the second roller rolling a lower surface of the first film, wherein the temperature controller is disposed in the first roller.

9. The film peeling apparatus of claim 8, further comprising a fluid supply unit connected to the temperature controller to provide a fluid to the temperature controller, wherein the temperature controller is formed in the first roller, and the temperature controller extends along a surface of the first roller and has a pipe shape to accommodate the fluid.

10. The film peeling apparatus of claim 8, further comprising:

grip units disposed in the chamber to respectively grip the first and second films peeled from the substrate; and driving units coupled to the grip units to move the grip units in the chamber.

11. The film peeling apparatus of claim 7, further comprising a second peeling roller disposed in the chamber to face the first peeling roller such that the substrate is disposed between the first peeling roller and the second peeling roller, wherein the second peeling roller rolls a second film that seals the substrate in cooperation with the first film to peel the second film from the substrate.

12. The film peeling apparatus of claim 7, further comprising a fluid pipe which connects the fluid path and a fluid supply unit which supplies cooling water.

* * * * *